(12) United States Patent
Still

(10) Patent No.: US 10,036,783 B1
(45) Date of Patent: Jul. 31, 2018

(54) DEVICE TESTING SYSTEMS AND METHODS

(71) Applicant: Western Digital Technologies, Inc., Irvine, CA (US)

(72) Inventor: David N. Still, Santa Ana, CA (US)

(73) Assignee: Western Digital Technologies, Inc., San Jose, CA (US)

( * ) Notice: Subject to any disclaimer, the term of this patent is extended or adjusted under 35 U.S.C. 154(b) by 832 days.

(21) Appl. No.: 14/303,910

(22) Filed: Jun. 13, 2014

(51) Int. Cl.
*G01R 27/28* (2006.01)
*G01R 31/44* (2006.01)

(52) U.S. Cl.
CPC .................................... *G01R 31/44* (2013.01)

(58) Field of Classification Search
CPC .. G01R 31/2635; G01R 31/308; G01R 31/44; H04L 43/50; H04L 12/2697
USPC ............................ 702/117; 324/414, 750.15
See application file for complete search history.

(56) References Cited

U.S. PATENT DOCUMENTS

| | | | |
|---|---|---|---|
| 6,502,212 B1* | 12/2002 | Coyle ................... | G06F 11/221 710/15 |
| 6,806,715 B1 | 10/2004 | Domadia et al. | |
| 7,701,705 B1 | 4/2010 | Szeremeta | |
| 8,064,194 B2 | 11/2011 | Szeremeta | |
| 8,113,873 B1 | 2/2012 | Sarraf | |
| 8,133,426 B1 | 3/2012 | Yurchenco et al. | |
| 8,358,395 B1 | 1/2013 | Szeremeta | |
| 8,417,979 B2 | 4/2013 | Maroney | |
| 8,462,460 B1 | 6/2013 | Szeremeta et al. | |
| 8,498,088 B1 | 7/2013 | Klein | |
| 8,547,658 B1 | 10/2013 | Szeremeta | |
| 2008/0155354 A1* | 6/2008 | Kolman ......... | G01B 31/318314 714/45 |
| 2008/0177534 A1* | 7/2008 | Wang .................... | H04M 3/002 704/211 |
| 2010/0229039 A1* | 9/2010 | Chikada ................. | G11C 29/10 714/27 |
| 2011/0055645 A1* | 3/2011 | Inoue .................... | G06F 11/263 714/718 |
| 2013/0242354 A1* | 9/2013 | Dewancker ............. | H04N 1/40 358/448 |
| 2013/0278539 A1* | 10/2013 | Valentine .............. | G06F 3/0418 345/174 |
| 2014/0091830 A1* | 4/2014 | Ishida .............. | G01R 31/31721 324/762.01 |
| 2014/0226828 A1* | 8/2014 | Klippel .................. | H04R 29/00 381/56 |
| 2014/0253372 A1* | 9/2014 | Davis ..................... | G01S 19/23 342/357.42 |
| 2015/0106670 A1* | 4/2015 | Gintis .................. | H04L 43/045 714/712 |

* cited by examiner

*Primary Examiner* — Stephanie Bloss
(74) *Attorney, Agent, or Firm* — Barry IP Law

(57) ABSTRACT

Systems and methods for testing a Device Under Test (DUT). A test condition is randomly selected from a plurality of test conditions to test the DUT. The DUT is controlled to attempt to output an output condition matching the randomly selected test condition and an operator is prompted to confirm that the output condition matches the randomly selected test condition.

15 Claims, 4 Drawing Sheets

DEVICE TESTING SYSTEMS AND METHODS

BACKGROUND

Quality assurance testing of electronic devices such as Data Storage Devices (DSDs) can include having a human operator confirm a state or condition of an electronic device being testing. For example, an operator testing a Device Under Test (DUT) may need to confirm that a Light Emitting Diode (LED), LED display or Liquid Crystal Display (LCD) displays a particular color or a test pattern. However, such testing can result in the operator missing a failure after repeatedly testing many devices due to an "automatic response" of the operator to repeat a pattern of behavior.

BRIEF DESCRIPTION OF THE DRAWINGS

The features and advantages of the embodiments of the present disclosure will become more apparent from the detailed description set forth below when taken in conjunction with the drawings. The drawings and the associated descriptions are provided to illustrate embodiments of the disclosure and not to limit the scope of what is claimed.

DETAILED DESCRIPTION

In the following detailed description, numerous specific details are set forth to provide a full understanding of the present disclosure. It will be apparent, however, to one of ordinary skill in the art that the various embodiments disclosed may be practiced without some of these specific details. In other instances, well-known structures and techniques have not been shown in detail to avoid unnecessarily obscuring the various embodiments.

Figure 1:
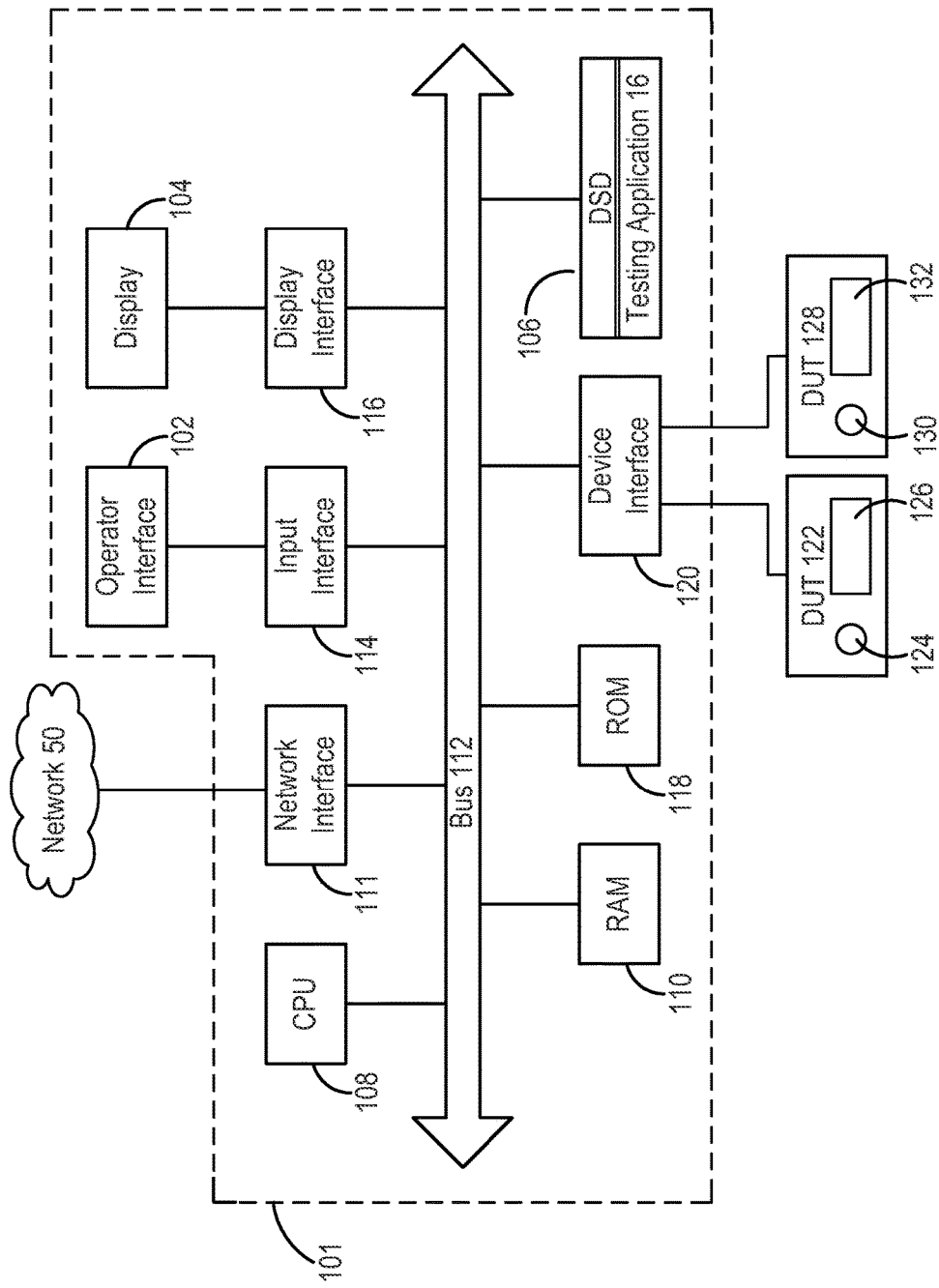
FIG. 1 is a block diagram of a testing system with two Devices Under Test (DUTs) according to an embodiment.

FIG. 1 shows test system 101 connected to a first Device Under Test (DUT) 122 and a second DUT 128 for testing DUT 122 and DUT 128 according to an embodiment. DUTs 122 and 128 can include electronic devices with components that are tested as part of a quality assurance test. In other embodiments, test system 101 may be connected to a different number of DUTs. In this regard, the testing processes discussed below can be performed for one DUT at a time or for multiple DUTs at the same time.

Test system 101 can be, for example, a computer system such as a server, desktop, laptop, tablet, or other mobile device. In this regard, test system 101 may be a stand-alone system or part of a network, such as network 50, which can, for example, be a local or wide area network or the Internet.

Those of ordinary skill in the art will appreciate that test system 101 and DUTs 122 and 128 can include more or less than those elements shown in FIG. 1 and that the disclosed processes can be implemented in other environments.

As shown in the example of FIG. 1, test system 101 includes Central Processing Unit (CPU) 108 which can be implemented using one or more processors for executing instructions including a microcontroller, a Digital Signal Processor (DSP), an Application Specific Integrated Circuit (ASIC), a Field Programmable Gate Array (FPGA), hard-wired logic, analog circuitry and/or a combination thereof.

Operator interface 102 can be a keyboard, scroll wheel, or pointing device allowing an operator of test system 101 to enter information and commands to test system 101, or to allow an operator to manipulate objects displayed on display 104. In other embodiments, operator interface 102 and display 104 can be combined into a single component, such as a touch-screen that displays objects and receives operator input.

Test system 101 also includes Random Access Memory (RAM) 110, input interface 114 for operator interface 102, display interface 116 for display 104, Read Only Memory (ROM) 118, network interface 111, Data Storage Device (DSD) 106, and device interface 120 for interfacing with DUTs 122 and 128.

RAM 110 is a volatile memory of test system 101 that interfaces with bus 112 so as to provide information stored in RAM 110 to CPU 108 during execution of instructions in software programs such as testing application 16 for testing DUTs 122 and 128. More specifically, CPU 108 first loads computer-executable instructions from DSD 106 or another DSD into a region of RAM 110. CPU 108 can then execute the stored process instructions from RAM 110. Data such as data to be stored in DSD 106 or data retrieved from DSD 106 can also be stored in RAM 110 so that the data can be accessed by CPU 108 during execution of software programs to the extent that such software programs have a need to access and/or modify the data.

As shown in FIG. 1, DSD 106 can be configured to store programs such as testing application 16 which can be used by test system 101 as a tool for interfacing with and testing DUTs 122 and 128 in accordance with the test processes discussed below.

Device interface 120 can be configured to interface test system 101 with DUTs 122 and 128 according to a standard. In one implementation DUTs 122 and 128 include DSDs such as a hard disk drive, flash storage drive, external hard drive, or digital video recorder. In such implementations, device interface 120 may use a standard such as Serial Advanced Technology Attachment (SATA), PCI express (PCIe), or Serial Attached SCSI (SAS). In other implementations where DUTs 122 and 128 are a different type of electronic device, device interface 120 may use a different standard for communicating with DUTs 122 and 128.

As shown in FIG. 1, each of DUTs 122 and 128 include a Light Emitting Diode (LED) or grouping of LEDs (i.e., LEDs 124 and 130, respectively) and a Liquid Crystal Display (LCD) (i.e., LCDs 126 and 132, respectively) that are tested as part of a quality assurance process as discussed below. In other embodiments, DUTs 122 and 128 may include other components that are tested using the processes discussed below such as a different type of display or an audio device.

Figure 2:
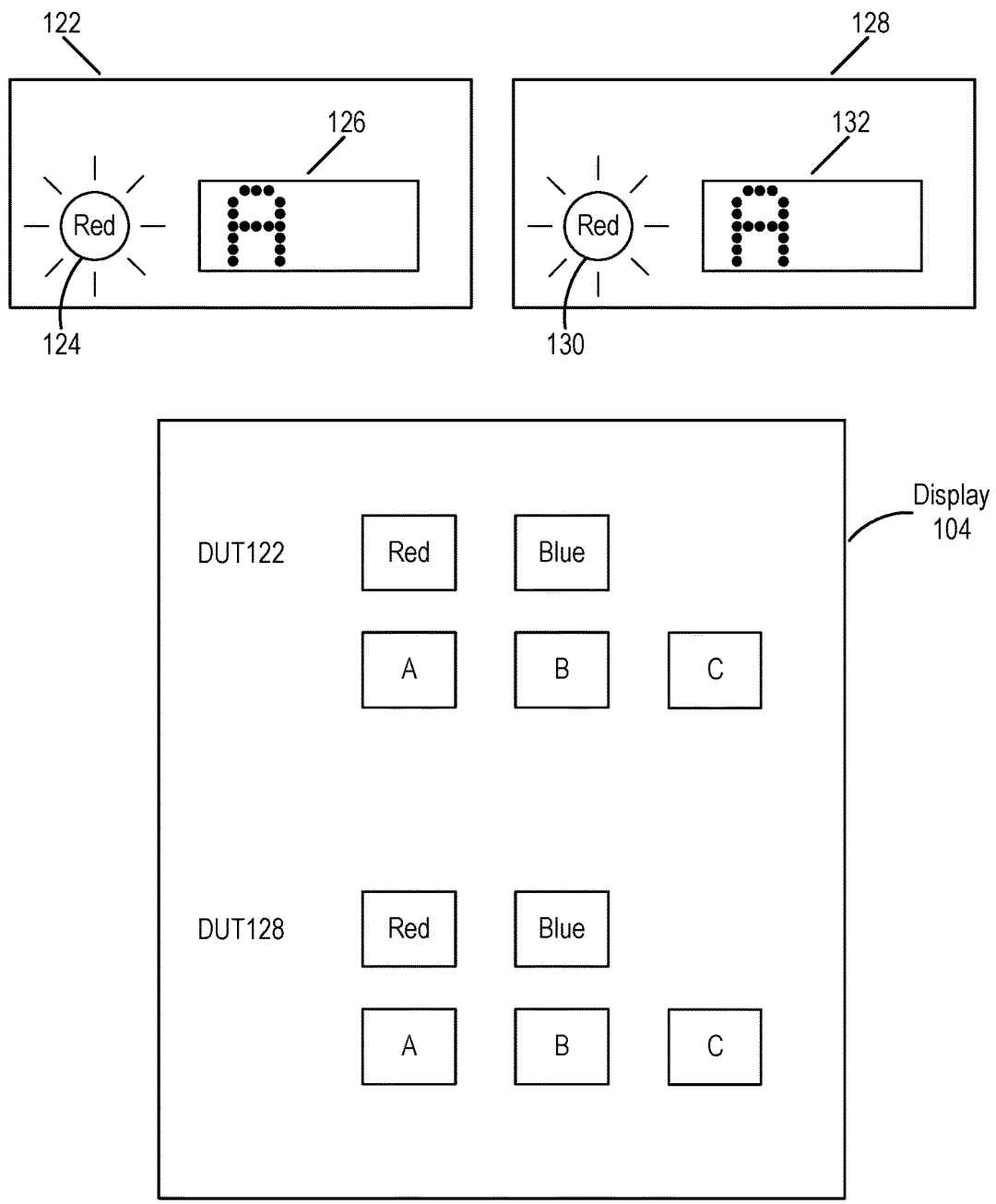
FIG. 2 depicts the DUTs of FIG. 1 during a testing process and a display of the testing system of FIG. 1 according to an embodiment.

FIG. 2 depicts DUTs 122 and 128 during a testing process and an example of display 104 during the testing process according to an embodiment. As shown in FIG. 2, both LEDs 124 and 130 emit a red light and both LCDs 126 and 132 display the letter "A." In accordance with the testing processes disclosed herein, these outputs are randomly selected by test system 101 from a plurality of test conditions. Test system 101 then prompts an operator to confirm that the output condition or state of DUTs 122 and 128 match the randomly selected test condition.

In the example of FIG. 2, test system 101 prompts an operator input by indicating different test conditions on display 104 for the operator to select a test condition that matches the output condition. The test conditions shown on display 104 may include all of the possible test conditions or a subset of possible test conditions. As shown in FIG. 2, display 104 prompts the operator to choose between a red light and a blue light for the LEDs of DUTs 122 and 128. Display 104 also prompts the operator to choose between the letters "A", "B" and "C" for the LCDs of DUTs 122 and 128.

By using a randomly selected test condition, it is ordinarily possible to reduce the likelihood of an operator having an "automatic response" after repeatedly performing many tests where the operator may expect a particular output condition or repeat a particular pattern. Such an automatic response is often strong enough to cause an operator to either not notice a failed component or to inadvertently indicate the wrong test condition.

Figure 3:
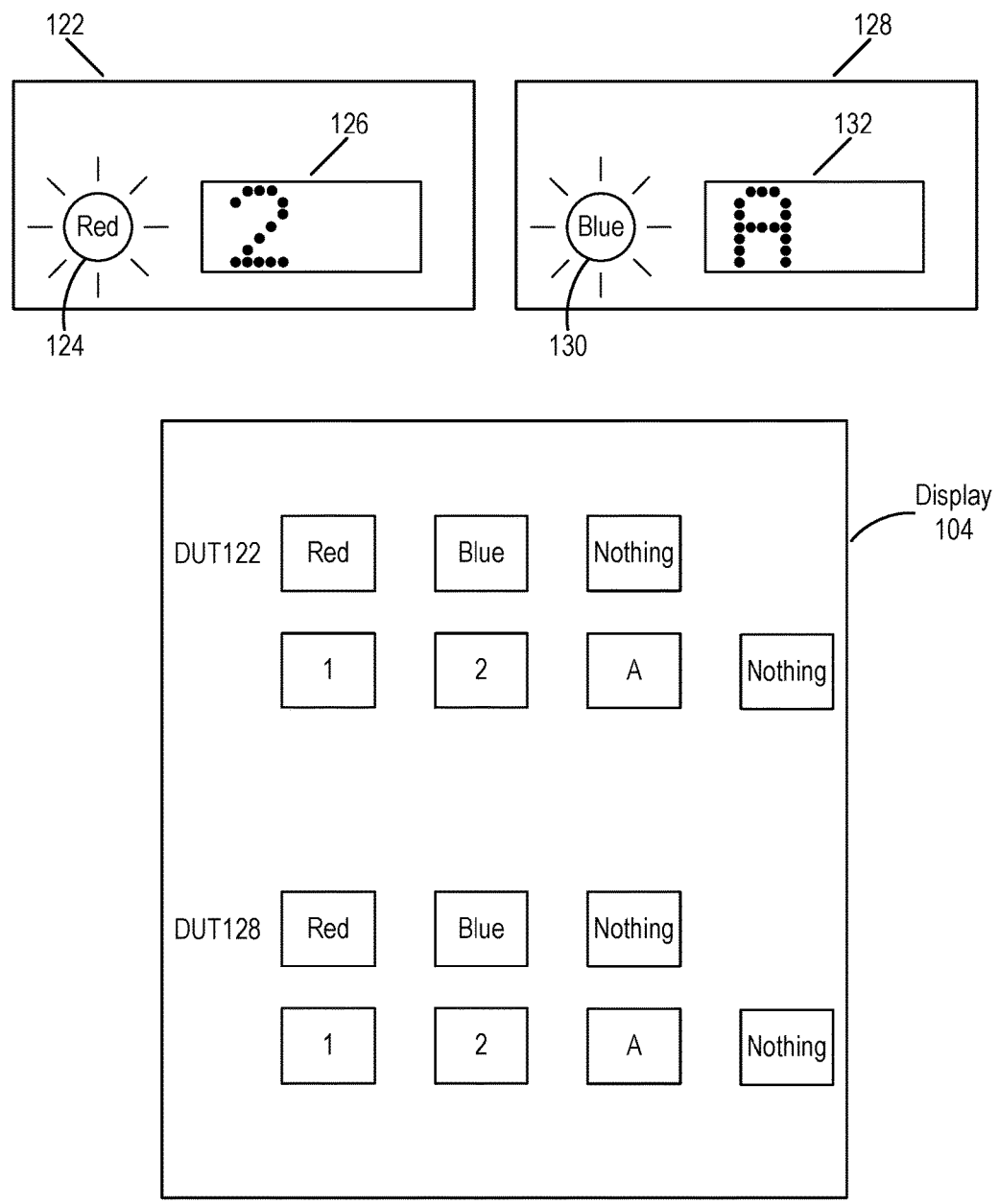
FIG. 3 depicts the DUTs of FIG. 1 during a testing process and a display of the testing system of FIG. 1 according to another embodiment.

FIG. 3 depicts DUTs 122 and 128 during another example of a testing process using display 104 according to an embodiment. Unlike the example of FIG. 2 discussed above, the randomly selected test condition in FIG. 3 is different for each of DUTs 122 and 128. In addition, the testing of DUTs 122 and 128 in the example of FIG. 2 above may occur in parallel while the testing in FIG. 3 may occur in series with the testing of one DUT at a time.

In the example of FIG. 3, test system 101 controls DUT 122 via device interface 120 to output a red light with LED 124 and to display "2" on LCD 126. In contrast, test system 101 controls DUT 128 via device interface 120 to output a blue light with LED 130 and to display "A" on LCD 132.

Display 104 indicates multiple test conditions in addition to a condition or state with no output with "nothing" shown on display 104. As with the example of FIG. 2, the number of test conditions displayed on display 104 can vary.

Figure 4:
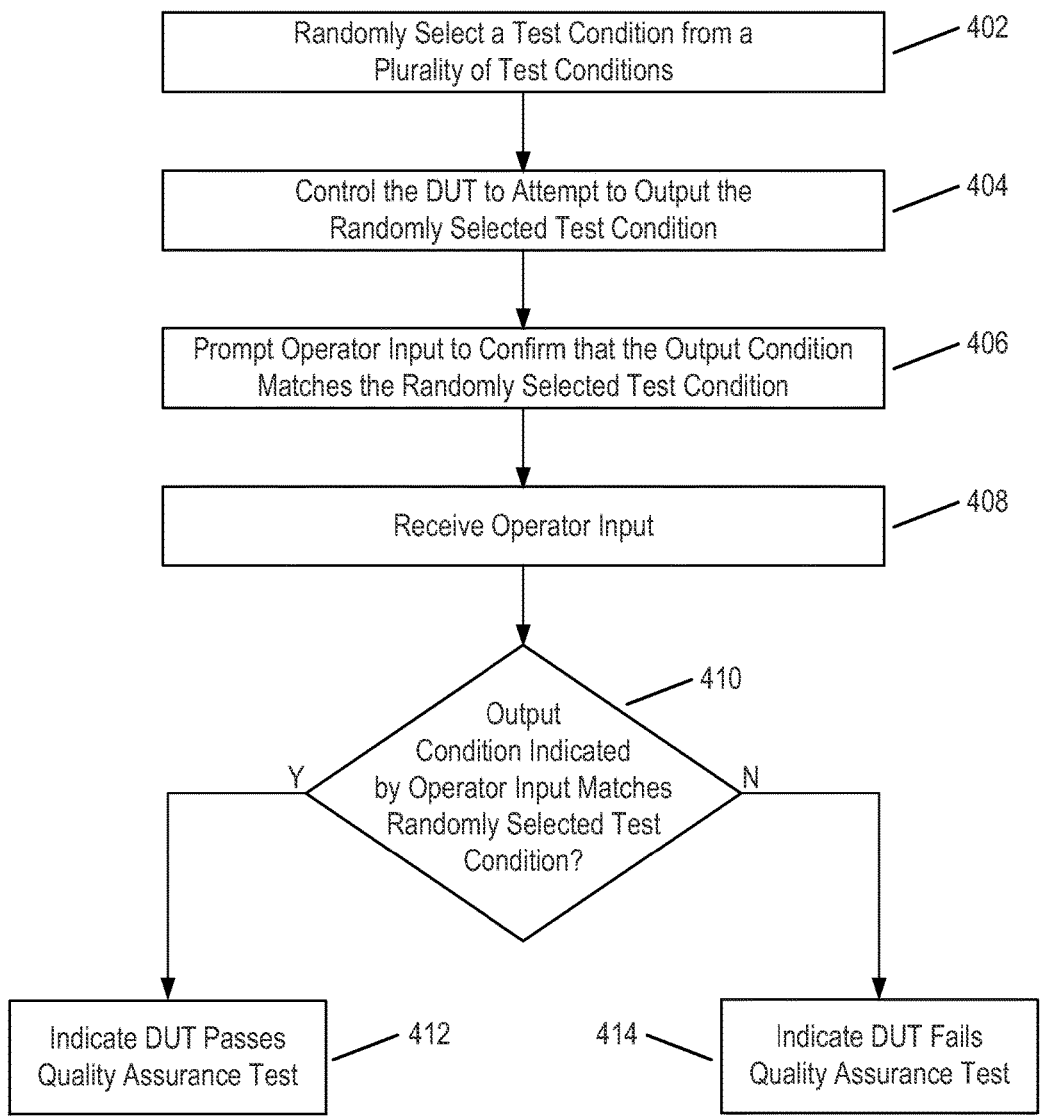
FIG. 4 is a flowchart for a testing process according to an embodiment.

FIG. 4 is a flowchart for a testing process that can be performed by test system 101 according to an embodiment. In one implementation, the test process of FIG. 4 may be performed by the execution of testing application 16 by CPU 108.

The process of FIG. 4 begins in block 402 where CPU 108 randomly selects a test condition from a plurality of test conditions. The selected test condition may be a visual condition as in the case of LEDs 124 and 130 or LCDs 126 and 132 discussed above. In other implementations, the test condition can be a sound such as a number of test beeps.

In block 404, test system 101 controls at least one DUT via device interface 120 to attempt to output the randomly selected test condition. In a case where the DUT has a defective component, the DUT may not be capable of outputting the randomly selected test condition.

In block 406, test system 101 prompts an operator input to confirm that the output condition of the DUT matches the randomly selected test condition. The prompting may be accomplished by displaying a plurality of test conditions for the operator to select a test condition matching the output condition of the DUT.

In block 408, test system 101 receives an operator input via operator interface 102. As noted above, operator interface 102 can include a keyboard, scroll wheel, touch-screen or pointing device allowing the operator to select a test condition displayed on display 104.

In block 410, CPU 108 compares the output condition indicated by the operator input with the randomly selected test condition to determine whether the output condition matches the randomly selected test condition. If it is determined that the output condition indicated by the operator input matches the randomly selected test condition, test system 101 indicates in block 412 that the DUT passes the quality assurance test. The indication may, for example, be made on display 104 or with an audible sound.

On the other hand, if it is determined that the output condition does not match the randomly selected test condition, test system 101 indicates in block 414 that the DUT fails the quality assurance test. The indication may, for example, be made on display 104 or with an audible sound.

Those of ordinary skill in the art will appreciate that the various illustrative logical blocks, modules, and processes described in connection with the examples disclosed herein may be implemented as electronic hardware, computer software, or combinations of both. Furthermore, the foregoing processes can be embodied on a computer readable medium which causes a processor, controller, or computer to perform or execute certain functions.

To clearly illustrate this interchangeability of hardware and software, various illustrative components, blocks, and modules have been described above generally in terms of their functionality. Whether such functionality is implemented as hardware or software depends upon the particular application and design constraints imposed on the overall system. Those of ordinary skill in the art may implement the described functionality in varying ways for each particular application, but such implementation decisions should not be interpreted as causing a departure from the scope of the present disclosure.

The various illustrative logical blocks, units, modules, and controllers described in connection with the examples disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The activities of a method or process described in connection with the examples disclosed herein may be embodied directly in hardware, in a software module executed by a processor, or in a combination of the two. The steps of the method or algorithm may also be performed in an alternate order from those provided in the examples. A software module may reside in RAM memory, flash memory, ROM memory, EPROM memory, EEPROM memory, registers, hard disk, a removable media, an optical media, or any other form of storage medium known in the art. An exemplary storage medium is coupled to the processor such that the processor can read information from, and write information to, the storage medium. In the alternative, the storage medium may be integral to the processor. The processor and the storage medium may reside in an Application Specific Integrated Circuit ASIC.

The foregoing description of the disclosed example embodiments is provided to enable any person of ordinary skill in the art to make or use the embodiments in the present disclosure. Various modifications to these examples will be readily apparent to those of ordinary skill in the art, and the principles disclosed herein may be applied to other examples without departing from the spirit or scope of the present disclosure. The described embodiments are to be considered in all respects only as illustrative and not restrictive and the scope of the disclosure is, therefore, indicated by the following claims rather than by the foregoing description. All changes which come within the meaning and range of equivalency of the claims are to be embraced within their scope.

What is claimed is:

1. A test system for testing an electronic Device Under Test (DUT), the test system comprising:
 a device interface for communicating with the electronic DUT;
 a display for prompting an operator input from an operator of the test system, the operator input indicating an output condition of the electronic DUT; and
 a processor configured to:
  randomly select a test condition from a plurality of test conditions to test the electronic DUT, wherein the randomly selected test condition is a visual output condition of at least one of a Liquid Crystal Display (LCD), a Light Emitting Diode (LED), and an LED display;
  control the electronic DUT using the device interface to attempt to output a visual output condition on at least one of an LCD, an LED, and an LED display of the DUT matching the randomly selected test condition; and
  prompt the operator input on the display to confirm that the output condition of the electronic DUT matches the randomly selected test condition.

2. The test system of claim 1, further comprising an operator interface for receiving the operator input, and wherein the processor is further configured to:
 receive the operator input using the operator interface; and
 compare the output condition indicated by the operator input with the randomly selected test condition.

3. The test system of claim 2, wherein the processor is further configured to:
 indicate that the electronic DUT fails a quality assurance test if the output condition indicated by the operator input does not match the randomly selected test condition; and
 indicate that the electronic DUT passes the quality assurance test if the output condition indicated by the operator input matches the randomly selected test condition.

4. The test system of claim 1, wherein the output condition indicated by the operator input indicates that the electronic DUT did not output a test condition.

5. The test system of claim 1, wherein the processor is further configured to prompt the operator input by indicating on the display at least two test conditions of the plurality of test conditions for the operator to select one of the at least two test conditions that matches the output condition.

6. A method for testing an electronic Device Under Test (DUT), the method comprising:
 randomly selecting a test condition from a plurality of test conditions to test the electronic DUT, wherein the randomly selected test condition is a visual output condition of at least one of a Liquid Crystal Display (LCD), a Light Emitting Diode (LED), and an LED display;
 controlling the electronic DUT to attempt to output a visual output condition on at least one of an LCD, an LED, and an LED display of the DUT matching the randomly selected test condition; and
 prompting an operator input to confirm that the output condition matches the randomly selected test condition.

7. The method of claim 6, further comprising:
 receiving the operator input indicating the output condition of the electronic DUT; and
 comparing the output condition indicated by the operator input with the randomly selected test condition.

8. The method of claim 7, further comprising:
 indicating that the electronic DUT fails a quality assurance test if the output condition indicated by the operator input does not match the randomly selected test condition; and
 indicating that the electronic DUT passes the quality assurance test if the output condition indicated by the operator input matches the randomly selected test condition.

9. The method of claim 6, further comprising receiving an operator input indicating that the electronic DUT did not output a test condition.

10. The method of claim 6, further comprising prompting the operator by indicating on a display at least two test conditions of the plurality of test conditions for the operator to select one of the at least two test conditions that matches the output condition.

11. A non-transitory computer readable storage medium storing computer-executable instructions for testing an electronic Device Under Test (DUT), wherein when the computer-executable instructions are executed by a processor, the computer-executable instructions cause the processor to:
 randomly select a test condition from a plurality of test conditions to test the electronic DUT, wherein the randomly selected test condition is a visual output condition of at least one of a Liquid Crystal Display (LCD), a Light Emitting Diode (LED), and an LED display;
 control the electronic DUT to attempt to output a visual or sound output condition matching the randomly selected test condition on at least one of an LCD, an LED, and an LED display of the DUT; and
 prompt an operator input to confirm that the output condition matches the randomly selected test condition.

12. The non-transitory computer readable medium of claim 11, wherein when the computer-executable instructions are executed by the processor, the computer-executable instructions further cause the processor to:
 receive the operator input indicating the output condition of the electronic DUT; and
 compare the output condition indicated by the operator input with the randomly selected test condition.

13. The non-transitory computer readable medium of claim 11, wherein when the computer-executable instructions are executed by the processor, the computer-executable instructions further cause the processor to:
 indicate that the electronic DUT fails a quality assurance test if the output condition indicated by the operator input does not match the randomly selected test condition; and
 indicate that the electronic DUT passes the quality assurance test if the output condition indicated by the operator input matches the randomly selected test condition.

14. The non-transitory computer readable medium of claim 11, wherein when the computer-executable instructions are executed by the processor, the computer-executable instructions further cause the processor to receive an operator input indicating that the electronic DUT did not output a test condition.

15. The non-transitory computer readable medium of claim 11, wherein when the computer-executable instructions are executed by the processor, the computer-executable instructions further cause the processor to prompt the operator by indicating on a display at least two test conditions of the plurality of test conditions for the operator to select one of the at least two test conditions that matches the output condition.

* * * * *